United States Patent
Choi

(10) Patent No.: US 7,273,792 B2
(45) Date of Patent: Sep. 25, 2007

(54) SEMICONDUCTOR DEVICE AND FABRICATING METHOD THEREOF

(75) Inventor: Yong Keon Choi, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 162 days.

(21) Appl. No.: 11/024,742

(22) Filed: Dec. 30, 2004

(65) Prior Publication Data
US 2005/0145978 A1    Jul. 7, 2005

(30) Foreign Application Priority Data
Dec. 31, 2003    (KR) ................... 10-2003-0101930

(51) Int. Cl.
*H01L 21/762*    (2006.01)

(52) U.S. Cl. .............. 438/424; 438/435; 257/500; 257/501; 257/E21.549; 257/E21.55

(58) Field of Classification Search ........ 438/424–438; 257/E21.55, E21.549, 501
See application file for complete search history.

(56) References Cited

U.S. PATENT DOCUMENTS

| 5,683,908 A * | 11/1997 | Miyashita et al. ........... 438/430 |
| 6,627,512 B2 * | 9/2003 | Iwamatsu et al. ........... 438/424 |
| 6,858,515 B2 * | 2/2005 | Ishitsuka et al. ............ 438/424 |
| 6,900,090 B2 * | 5/2005 | Park .......................... 438/221 |
| 2003/0181022 A1 * | 9/2003 | Mehrad et al. ............. 438/437 |

* cited by examiner

*Primary Examiner*—Jerome Jackson
*Assistant Examiner*—Paul Budd
(74) *Attorney, Agent, or Firm*—Lowe Hauptman & Berner LLP

(57) ABSTRACT

A semiconductor device including a semiconductor substrate, a device isolation region formed by filling a trench in the semiconductor substrate with dielectric material and defining device regions in the semiconductor substrate. The trench has a rounded upper edge, and a dummy thin layer formed on the rounded upper edge.

8 Claims, 4 Drawing Sheets

SEMICONDUCTOR DEVICE AND FABRICATING METHOD THEREOF

BACKGROUND OF THE INVENTION (a) Field of the Invention

The present invention relates to a semiconductor device and a method for fabricating a semiconductor device.

(b) Description of the Related Art

As semiconductor devices have been implemented for various applications, different device characteristics are required. For example, there can be a device such as a logic and central processing unit (CPU) merged with Dynamic Random Access Memory (DRAM) or Static Random Access Memory (SRAM). Accordingly, a high voltage device and low voltage device can be formed in a single substrate.

Typically, the low voltage device is fabricated with a device isolation region through an STI technique and the high voltage device is fabricated with the device isolation region through a LOCOS technique. For the STI technique, a trench is formed at a predetermined area of the substrate and then the trench is filled with a dielectric material so as to form a device isolation region. In contrast, for the LOCOS technique, the device isolation region is formed by oxidizing a predetermined area of the substrate, such that it is impossible to perform the both processes. This is because the high voltage device is sensitive to the profile of the edge of the device isolation region formed by the STI technique in comparison to the low voltage device. Since the device reliability and characteristic depends on the profile of the edge, the LOCOS technique is conventionally used for forming the device isolation region.

As electric circuits have been highly integrated, a semiconductor device having both high and low voltage devices is required. Accordingly, it is required that even the device isolation region of the high voltage device should be formed using the STI technique. However, if the device isolation region of the high voltage device is formed using the STI technique, electric fields are concentrated at the device isolation region such that the device's characteristics are degraded.

SUMMARY OF THE INVENTION

The present invention has been made in an effort to solve the above problem, and it is an object of the present invention to provide a semiconductor device having a high voltage device and a method for fabricating the semiconductor device capable of forming a device isolation region using a shallow trench isolation technique.

To achieve the above object, the semiconductor device according to an exemplary embodiment of the present invention is fabricated such that the edge of the device isolation is formed with a round shape by performing additional high temperature thermal oxidization while forming a device isolation region of a high voltage device.

In one aspect of the present invention, the semiconductor device includes a semiconductor substrate, a device isolation region structured by filling a trench formed within the semiconductor substrate with dielectric material and defining device regions in the semiconductor substrate, the trench having a rounded upper edge, and a dummy thin layer formed on the rounded upper edge.

In an exemplary embodiment, the device isolation region protrudes from a surface of the semiconductor substrate.

In an exemplary embodiment, the device regions are operated by different voltage levels, and the device region at which the dummy thin layer is formed is operated by a voltage higher than that applied to another device region.

In another aspect of the present invention, a method for fabricating a semiconductor device includes depositing a first sacrificing oxide layer and a first sacrificing nitride layer on a semiconductor substrate, exposing the substrate by selectively removing the first sacrificing nitride layer and the first sacrificing oxide layer through an etch process, forming a trench within the substrate by removing the exposed substrate, forming a device isolation region by filling the trench with dielectric material, the device isolation region defining a first and second device regions, depositing a second sacrificing nitride layer and a second sacrificing oxide layer on the substrate, removing the second sacrificing oxide layer and the second sacrificing nitride layer on the first device region through a selective etch process, and forming a dummy thin layer along an edge of the trench close to the first device region by performing a high temperature thermal treatment on the substrate.

In an exemplary embodiment, the edge is formed so as to be rounded during the high temperature thermal treatment.

In an exemplary embodiment, the dummy thin layer is formed so as to be rounded along the round edge.

In an exemplary embodiment, the high temperature thermal treatment is performed at a temperature of 1000° C. and higher.

It is to be understood that both the foregoing general description of the invention and the following detailed description are exemplary, but are not restrictive of the invention.

DETAILED DESCRIPTION OF THE INVENTION

Figure 1:
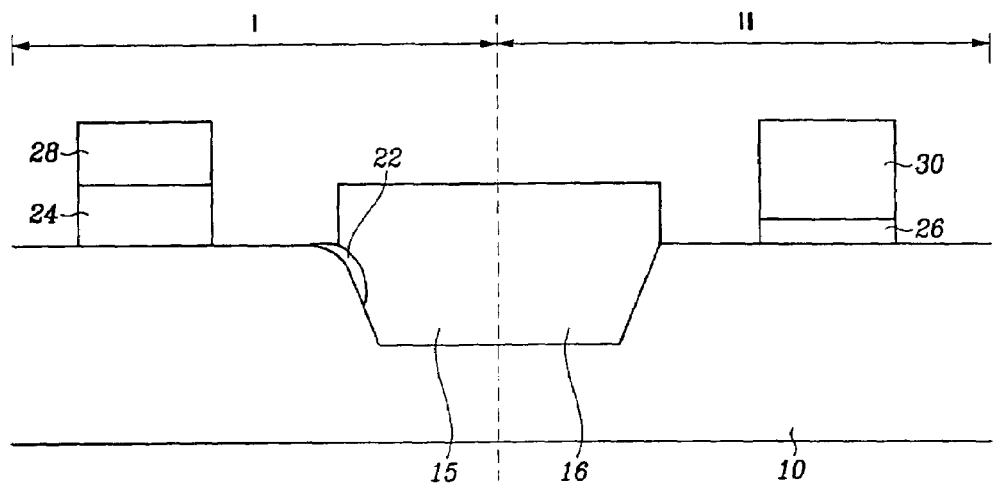
FIG. 1 is a cross sectional view illustrating a semiconductor device according to an exemplary embodiment of the present invention.

With reference to the accompanying drawings, the present invention will be described in order for those skilled in the art to be able to implement. However, the invention is not limited to the embodiments to be described hereinafter, but, to the contrary, is intended to cover various modifications and equivalent arrangements included within the sprit and scope of the appended claims.

To clarify multiple layers and regions, the thickness of the layers are enlarged in the drawings. Wherever possible, the same reference numbers will be used throughout the drawing(s) to refer to the same or like parts. When it is said any part such as a layer, film, area, or plate is positioned "on" another part, it means the part is right on the other part or above the other part with at least one intermediate part. Further, when it is said that any part is positioned "right on" another part, it means that there is no intermediate part between the two parts (i.e. the parts are in direct contact).

The semiconductor device according to an exemplary embodiment of the present invention will be described hereinafter with reference to the accompanying drawings.

FIG. 1 is a cross sectional view illustrating a semiconductor device according to an exemplary embodiment of the present invention.

As shown in FIG. 1, an active region in which a semiconductor device to be arranged is defined on a semiconductor substrate 10, such as silicon. A device isolation region 16 is formed to isolate the semiconductor devices from each other. A first device region (I) and a second device region (II) are defined by the device isolation region 16. To the first device region (I) and the second device region (II) high and low voltages are applied, respectively.

The device isolation 16 is formed so as to protrude from the surface of the semiconductor substrate by filling a trench (T) of the semiconductor substrate 10 with dielectric material. The upper parts of the trench close to the respective device regions have different profiles from each other. That is, the edge of the trench close or adjacent to the first device region (I) is formed so as to be rounded and a dummy thin layer 22 is formed along the rounded edge. On the other hand, the edge of the trench close to the second device region (II) is angled and has no dummy thin layer. The dummy thin layer 22 is an oxide layer formed by thermal oxidization process.

In each of the first device region (I) and the second device region (II), a source region and a drain region (not shown) are formed by doping conductive impurity ions at a high concentration level. A channel region is formed between the source and drain regions. The channel region is an intrinsic semiconductor region formed without doping conductive impurities. Low concentration doping regions (not shown) can be formed between the source region and the channel region and between the drain region and channel region.

On the surface of the semiconductor substrate 10, gate oxides 24 and 26 and gates 28 and 30 formed with polycrystalline silicon. Here, the gate oxides 24 and 26 are formed with different thicknesses, which depend on the voltages to be applied to the gates 28 and 30. In an exemplary embodiment of the present invention, the first device region (I) is a high voltage region, and thus is formed thicker than the second device region (II), which is a low voltage region.

A method for fabricating the above structured semiconductor device according to an exemplary embodiment of the semiconductor device will described in detail hereinafter with reference to the accompanying drawings.

FIG. 2 to FIG. 7 are cross-sectional views illustrating fabrication steps for the semiconductor device according to an exemplary embodiment of the present invention.

Figure 2:
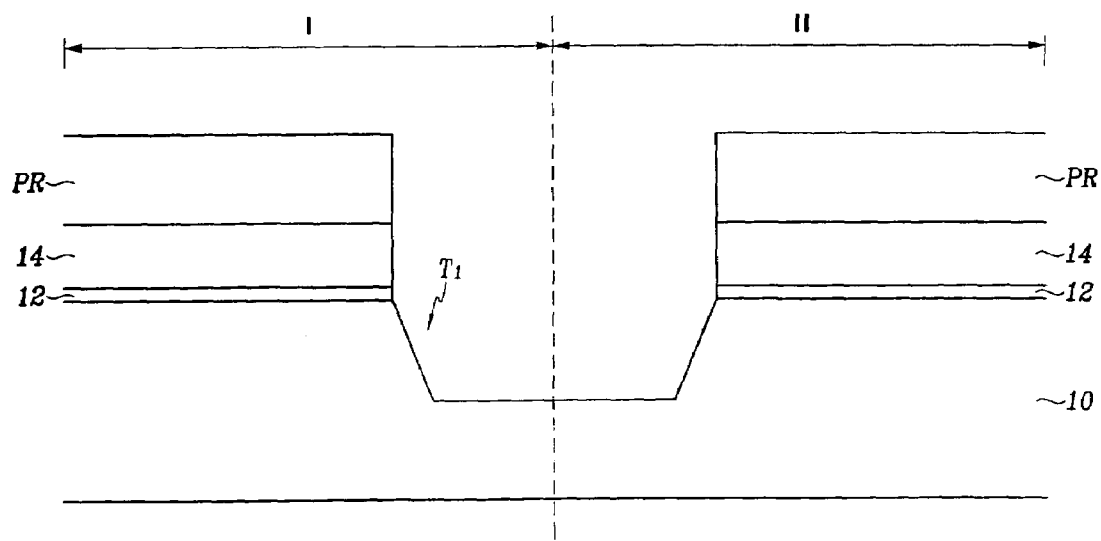
FIG. 2 to FIG. 7 are cross-sectional views illustrating fabrication steps for the semiconductor device according to an exemplary embodiment of the present invention.

Referring to FIG. 2, a first sacrificing oxide layer 12 and a first sacrificing nitride layer 14 are formed on the semiconductor substrate. The first device region (I) and the second device region (II) are defined in sequential order. The first sacrificing oxide layer 12 is formed at a thickness of 150 Å or less, and the first sacrificing nitride layer 14 is formed at a thickness of 2000 Å or less.

In the first and second device regions I and II, respective semiconductor devices to which different voltages are applied are formed. In an exemplary embodiment of the present invention, a high voltage device is formed in the first device region (I) and a low voltage device is formed in the second device region (II).

Next, a photoresist pattern (PR) is formed by depositing a photoresist layer on the first sacrificing nitride layer 14, and patterning the photoresist layer through a photolithography process. The trench T1 is formed by etching the first sacrificing nitride layer 14, the first sacrificing oxide layer, and the semiconductor substrate.

Figure 3:
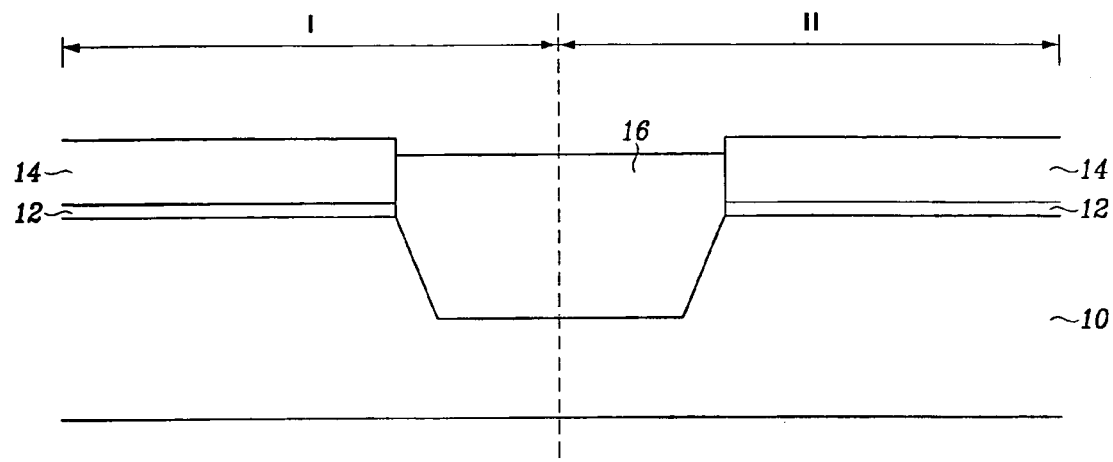

Referring to FIG. 3, after removing the photoresist pattern (PR) a thin oxide layer (not shown) is formed on the inner walls of the trench T1 by oxidizing the semiconductor substrate 10. A dielectric layer is formed on the semiconductor substrate 10 by depositing a dielectric material such as silicon oxide so as to fill the trench T1.

The dielectric layer is polished using a chemical mechanical polishing technique until the first sacrificing nitride layer 14 is exposed, such that the dielectric layer remains only in the trench, resulting in completion of the device isolation region 16. The device isolation region can be removed at a predetermined region.

Figure 4:
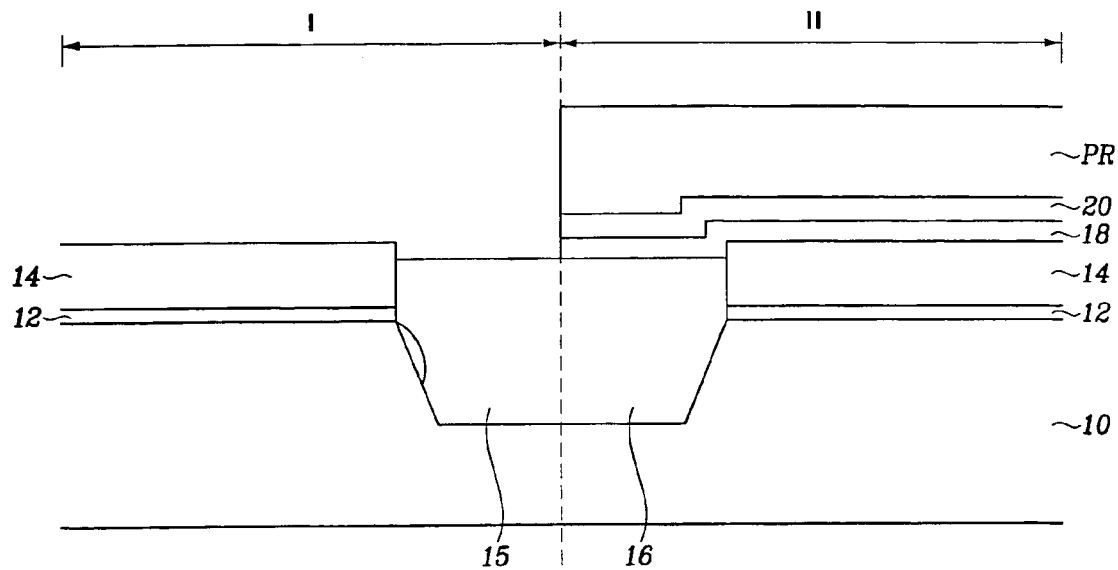

Referring to FIG. 4, a second sacrificing nitride layer 18 and a second sacrificing oxide layer 20 are formed on the entire surface of the present invention in sequential order. Here, the second sacrificing nitride layer 18 and the second sacrificing oxide layer 20 are formed at thicknesses below 100 Å and 150 Å, respectively.

Next, a photoresist pattern (PR) is formed by coating a photoresist film on the second sacrificing nitride layer 18, and patterning the photoresist film through a photolithography process. The photoresist pattern exposes the first device region (I) and the second device region (II) such that the second sacrificing oxide layer 20 and the second sacrificing nitride layer 18 exposed through the photoresist pattern (PR) are removed.

Figure 5:
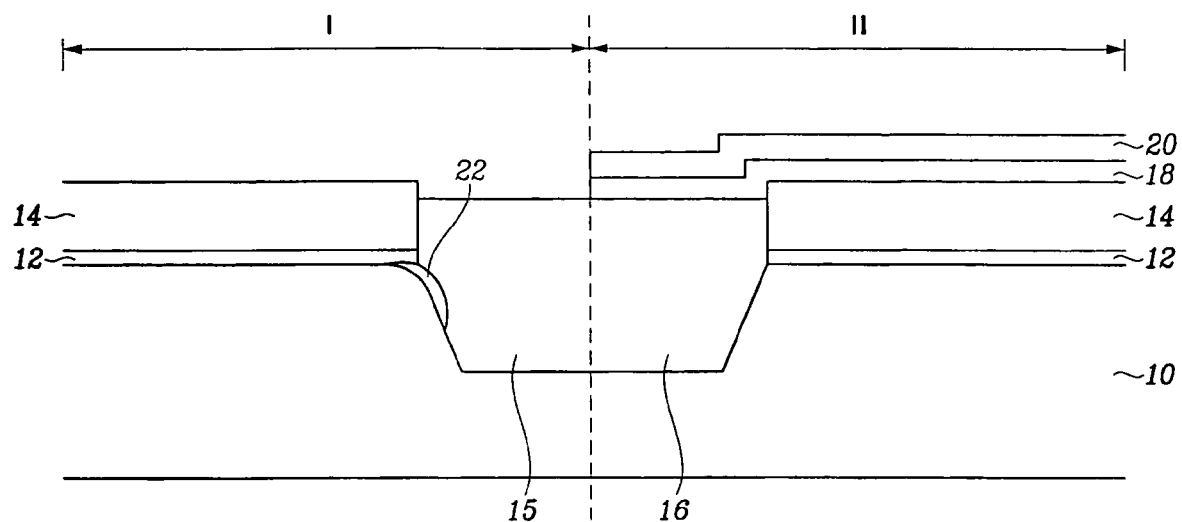

Referring to the FIG. 5, after removing the photoresist pattern (PR), a dummy thin layer 22 is formed by performing high temperature thermal oxidization. The oxidization process is carried out at a temperature over 1,000° C.

By forming the dummy thin layer 22 at an edge of the device isolation region 16 close to the first device region through the high temperature oxidization process, the edge of the first device region (I) defined by the trench T1 is rounded. Accordingly, the device isolation region 16 of the first device region (I) has a gradual descent profile, which prevents the electric field from being concentrated at the edge portion, such that it is possible to avoid damage to the device, even though the high voltage device is formed at the first device region.

Figure 6:
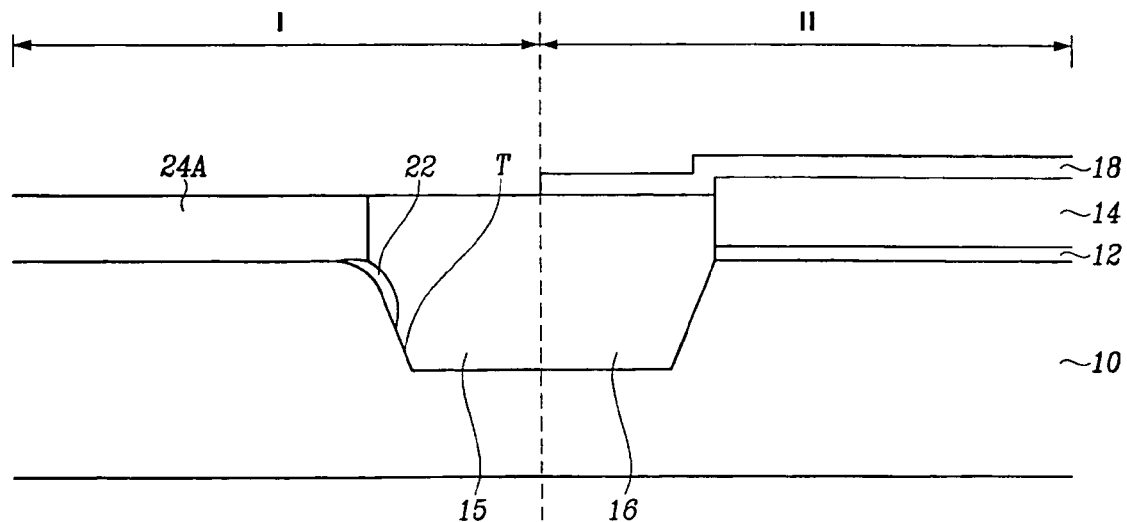

Referring to FIG. 6, the first sacrificing nitride layer 14 and the first sacrificing oxide layer 12 of the first device region (I) are removed using a wet etching technique. The second device region (II) is protected by the second sacrificing oxide layer 12 while the first sacrificing nitride layer 14 is etched, and the second sacrificing oxide layer 20 of the second device region (II) is removed while the first sacrificing oxide layer 12 is etched.

Sequentially, a first pad oxide layer 24A is formed on the first device region (I) with a thickness of 1,000 Å or less. Here, the second device region (II) is protected by the second sacrificing nitride layer 18.

Figure 7:
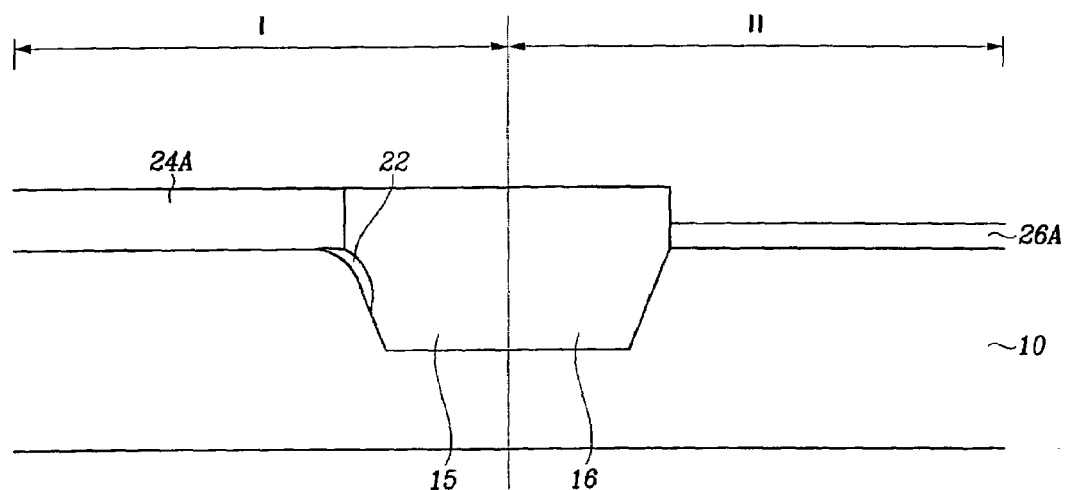

Referring to FIG. 7, a second pad oxide layer 26A is formed on the second device region (II) by oxidizing the semiconductor substrate 10 after the second sacrificing nitride layer 18, the first sacrificing nitride layer 14, and the first sacrificing oxide layer on the second device region (II) are removed. The second pad oxide layer 26A is formed thinner than the first pad oxide layer 24A.

Next, as shown in FIG. 1, the polycrystalline silicon layer is formed on the semiconductor substrate, and then the first pad oxide layer 24A and the second pad oxide layer 26A are selectively patterned together with the polycrystalline silicon layer so as to form the first and second gate oxide layers 24 and 26 and the gates 28 and 30.

A low doping concentration region, a source region and a drain region are formed by doping conductive impurity ions onto a predetermined region of the semiconductor substrate 10.

As described above, the dummy thin layer is formed at the device isolation region of the high voltage region and the boundary of the trench, in which the device isolation region is formed, is rounded such that it is possible to prevent the electric filed from being concentrated at the boundary, resulting in improvement of the semiconductor characteristic and device reliability. Also, since the edge of the high voltage region close to the device isolation region can be roundly formed without modifying the low voltage region, the productivity increases.

Figure 8:
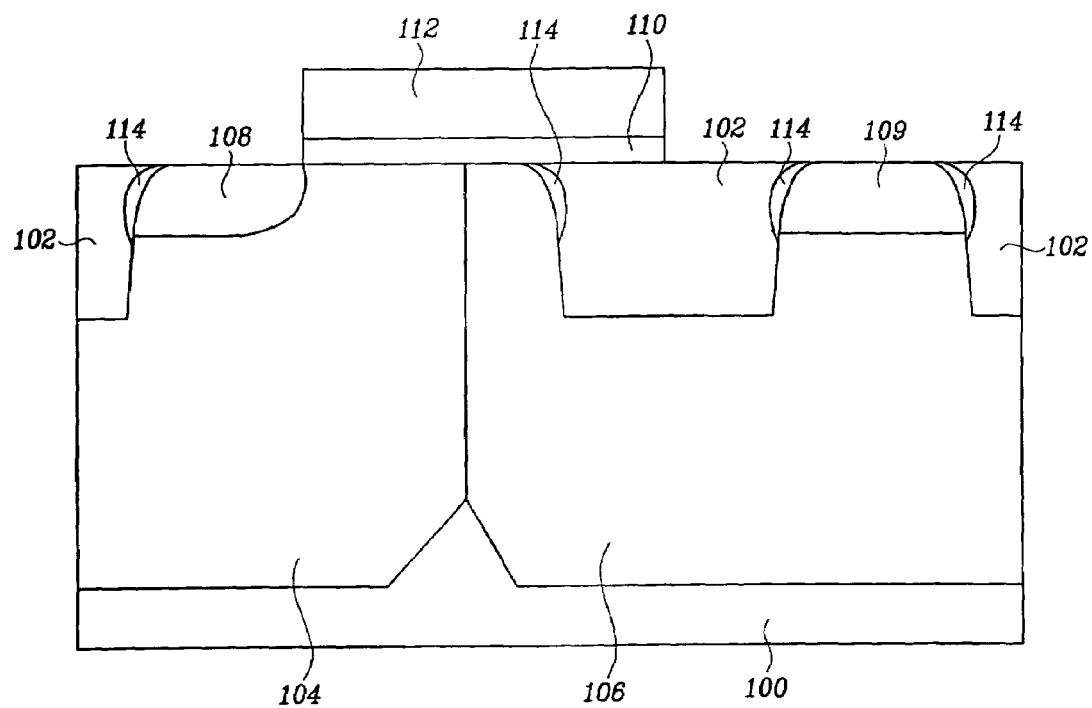
FIG. 8 is a cross sectional view schematically illustrating a drain extended NMOS according to another embodiment of the present invention.

This device isolation region structure is much practical to be implemented with the semiconductor device having a drain extended transistor illustrated in FIG. 8.

FIG. 8 is a cross sectional view schematically illustrating a drain extended NMOS according to another embodiment of the present invention.

As shown in FIG. 8, an N and P types wells 104 and 106 are formed on a substrate 100 in which a device isolation region 102 is formed. An N type drain region 109 is formed within the N type well, and an N type source region 108 is formed within the P type well.

Here, the edge of the device isolation region 102 is rounded and the dummy thin layer 114 is formed with a round edge.

On the substrate 100, a gate 112 is formed. The gate 112 is arranged close to the source region 108 and being partially overlapped with the N type well. A gate oxide layer 110 is formed between the gate 112 and the substrate 100.

As described above, according to the present invention it is possible to form the device isolation region, improving the characteristic of the device at the high voltage region and the low voltage region using the high temperature oxidation technique.

Korean Patent Application No. 10-2003-0101930, filed on Dec. 31, 2003, is incorporated herein by reference in its entirety.

Although exemplary embodiments of the present invention have been described in detail hereinabove, it should be clearly understood that many variations and/or modifications of the basic invention concepts herein taught which may appear to those skilled in the present art will still fall within the spirit and scope of the present invention, as defined in the appended claims.

What is claimed is:

1. A method for fabricating a semiconductor device, comprising steps of:
   depositing a first sacrificial oxide layer and a first sacrificial nitride layer on a semiconductor substrate;
   exposing the substrate by selectively removing the first sacrificial nitride layer and the first sacrificial oxide layer through an etch process;
   forming a trench within the substrate by removing the exposed substrate;
   forming a device isolation region by filling the trench with dielectric material, the device isolation region defining first and second device regions;
   depositing a second sacrificial nitride layer and a second sacrificial oxide layer on the substrate;
   removing the second sacrificial oxide layer and the second sacrificial nitride layer on the first device region through a selective etch process; and
   forming a dummy thin layer along an edge of the trench close to the first device region by performing a high temperature thermal treatment on the substrate.

2. The method of claim 1, wherein the step of forming a dummy thin layer includes forming a rounded edge of the trench, wherein the rounded edge is adjacent to the first device region.

3. The method of claim 2, wherein the step of forming a dummy thin layer includes forming the dummy thin layer to be rounded along the rounded edge of the trench.

4. The method of claim 1, wherein the step of forming a dummy thin layer includes performing a high temperature thermal treatment at a temperature of 1000° C. or higher.

5. A method for fabricating a semiconductor device, comprising:
   a step for depositing a first sacrificial oxide layer and a first sacrificial nitride layer on a semiconductor substrate;
   a step for exposing the substrate by selectively removing the first sacrificial nitride layer and the first sacrificial oxide layer through an etch process;
   a step for forming a trench within the substrate by removing the exposed substrate;
   a step for forming a device isolation region by filling the trench with dielectric material, the device isolation region defining first and second device regions;
   a step for depositing a second sacrificial nitride layer and a second sacrificial oxide layer on the substrate;
   a step for removing the second sacrificial oxide layer and the second sacrificial nitride layer on the first device region through a selective etch process; and
   a step for forming a dummy thin layer along an edge of the trench close to the first device region by performing a high temperature thermal treatment on the substrate.

6. The method of claim 5, wherein the step for forming a dummy thin layer includes a step for forming a rounded edge of the trench, wherein the rounded edge is adjacent to the first device region.

7. The method of claim 6, wherein the step for forming a dummy thin layer includes a step for forming the dummy thin layer to be rounded along the rounded edge of the trench.

8. The method of claim 5, wherein the step for forming a dummy thin layer includes a step for performing a high temperature thermal treatment at a temperature of 1000° C. or higher.

* * * * *